United States Patent [19]

Seiichiro

[11] Patent Number: 5,362,274
[45] Date of Patent: Nov. 8, 1994

[54] BLOWING PORT FOR CLEAN AIR OF AN APPARATUS FOR WASHING SEMICONDUCTOR MATERIALS

[76] Inventor: Aigo Seiichiro, 3-15-13, Negishi, Daito-ku, Tokyo, Japan

[21] Appl. No.: 606,524

[22] Filed: Oct. 31, 1990

[30] Foreign Application Priority Data

Nov. 14, 1989 [JP] Japan .................. 1-132330[U]

[51] Int. Cl.⁵ .............................................. F24F 9/00
[52] U.S. Cl. ...................................... 454/66; 454/190
[58] Field of Search ................... 98/36, 115.1, 115.3; 454/66, 190, 191, 193

[56] References Cited

U.S. PATENT DOCUMENTS

| | | | |
|---|---|---|---|
| 2,544,769 | 3/1951 | Sperry et al. | 98/115.1 |
| 3,203,337 | 8/1965 | Beckwith | 454/190 |
| 3,543,532 | 12/1970 | Gatton et al. | 98/36 X |
| 3,726,203 | 4/1973 | Lindestron | 98/36 |
| 3,771,323 | 11/1973 | Simons et al. | 98/36 X |
| 4,883,542 | 11/1989 | Voneff | 15/1.51 X |

FOREIGN PATENT DOCUMENTS

| | | | |
|---|---|---|---|
| 1053195 | 2/1954 | France | 98/115.1 |
| 473883 | 3/1929 | Germany | 98/115.1 |

Primary Examiner—Harold Joyce
Attorney, Agent, or Firm—Wegner, Cantor, Mueller & Player

[57] ABSTRACT

A blowing port of an apparatus for washing semiconductor materials, has a plurality of passages defined within the duct of the blowing port. At least the upper portion of each passage is formed convergently to its end. The end of each passage of the blowing port forms a transverse slit so as to form laminar flow of clean air flowing substantially horizontally from the blowing port to an opposite suction port. Such laminar air flow covers the respective washing tanks, and thus it prevents vapor generated in chemical washing tanks from entering final washing tanks. Accordingly semiconductor materials washed in final washing tank or tanks are not badly influenced with the described vapor.

3 Claims, 3 Drawing Sheets

BLOWING PORT FOR CLEAN AIR OF AN APPARATUS FOR WASHING SEMICONDUCTOR MATERIALS

BACKGROUND OF THE INVENTION

1) Field of the invention

The invention relates generally to an apparatus for washing semiconductor materials, and more specifically to a blowing port through which clean air flows out over a plurality of washing tanks disposed within a case.

2) Description of the prior art

In commonly accepted technique, this type of washing apparatus as shown in FIGS. 7-9 has been known. This washing apparatus has been used for washing semiconductor wafers as semiconductor materials which are housed in a carrier. In the carrier a suitable number of semiconductor wafers are set as one lot. As shown in FIG. 7, a plurality of washing tanks are located within a case, usually in two rows of which one row is consisted of tank or tanks for water including cleaning chemicals, and another row being consisted of tank or tanks for pure water used for final washing. If vapor generated in the cleaning chemical tanks enters the adjacent final washing tanks, it will influence on upper portion of semiconductor wafers in the tanks, which will result in stain film on the upper portion of the wafers.

In order to avoid this defect, the case of the washing apparatus has a blowing port at one side thereof and a suction port at opposite side of the case to flow clean air from the blowing port over the respective washing tanks to the suction port, to thereby prevent vapor of the cleaning chemical tanks from entering the final washing tanks. The clean air is fed to the blowing port by a fan through air filter.

Further, this type of washing apparatus is disposed in a clean room, and also clean air is discharged downwards through the ceiling of the clean room. Accordingly, the suction port serves to receive clean air flown from both the blowing port and the ceiling of the clean room.

One type of the conventional blowing ports is formed with many holes at the end thereof as shown in FIG. 8, and clean air flows out through the holes. Another type of the blowing port, as shown in FIG. 9, has an upwards extending duct of which uppermost portion is curved to generate a substantially horizontal air flow and is formed convergently to the end thereof.

Since the described former type in prior art discharges clean air through many holes, clean air flows out to a wider area, which results in turbulence in air flow. Thus this type is not preferable. Also, the latter type has a convergent discharge end portion, which will form a rather laminar air flow. However, when wafer carriers are inserted into or taken out from the washing tanks, there will be water splashes which will enter the interior of the blowing port. The air filter in the duct of the blowing port will be damaged with such water splashes.

SUMMARY OF THE INVENTION

Therefore, an object of the invention is to solve the described problems or drawbacks, and thus to provide an improved blowing port of an apparatus for washing semiconductor wafers, which enables to form an effective laminar flow of clean air as well as to prevent water splashes from entering the port.

In order to attain the object of the invention, a blowing port according to the invention has a plurality of passages defined within the duct of the port, and at least upper portion of each passage is formed convergently to its end which forms a transversely extending slit. Preferably, the respective slits have one or plurality of reinforcement chips. Also, preferably there are ionizers mounted on the end of the passages to ionize clean air flown out through the blowing port.

Such slit-type duct end of the blowing port enables to form laminar flow of clean air which covers above the respective washing tanks so as to prevent vapor of cleaning chemical tanks from entering the final washing tanks.

DETAILED DESCRIPTION OF THE INVENTION AND THE PREFERRED EMBODIMENTS

Figure 1:
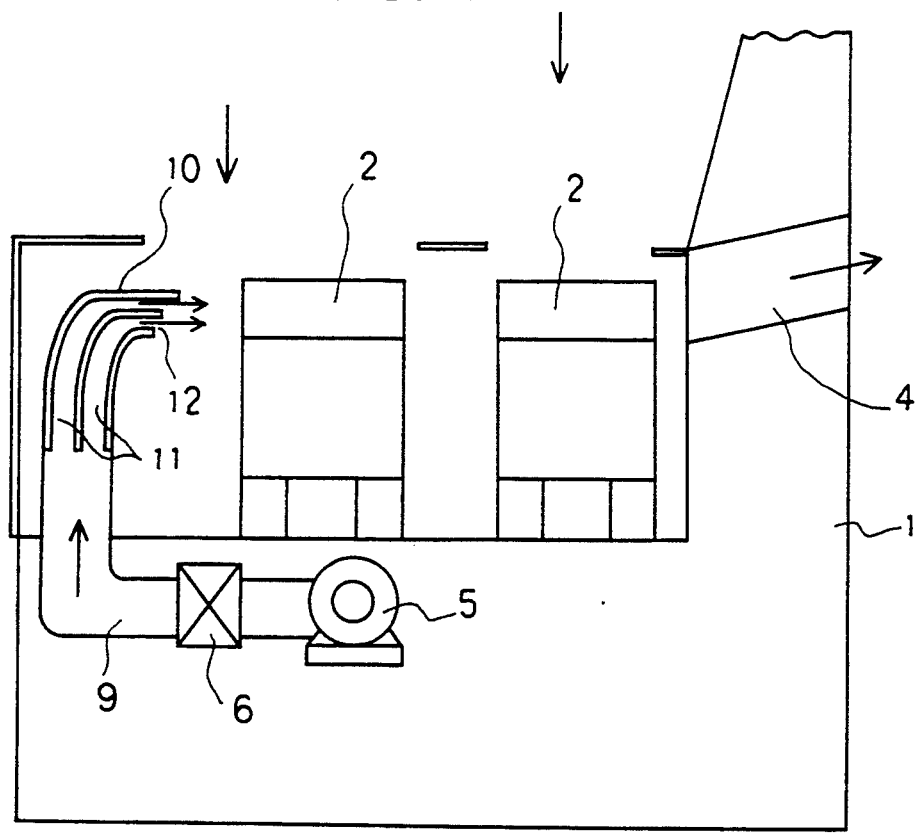
FIG. 1 is a side elevational view of an apparatus for washing semiconductor materials, which includes a blowing port embodied by the invention.

The invention will now be described with reference to the preferred embodiments. FIG. 1 shows an embodiment of a washing apparatus having a blowing port (10) of the invention. This blowing port (10) is also disposed at one side of a case (1) and flows out clean air therethrough to a suction port (4) opposed to the blowing port. The flow of clean air is above the respective washing tanks (2) within the case (1) in order to prevent vapor cleaning chemical tanks from entering washing tanks including pure water. In FIG. 1, (5) denotes a fan, and (6) is a filter.

Figure 2:
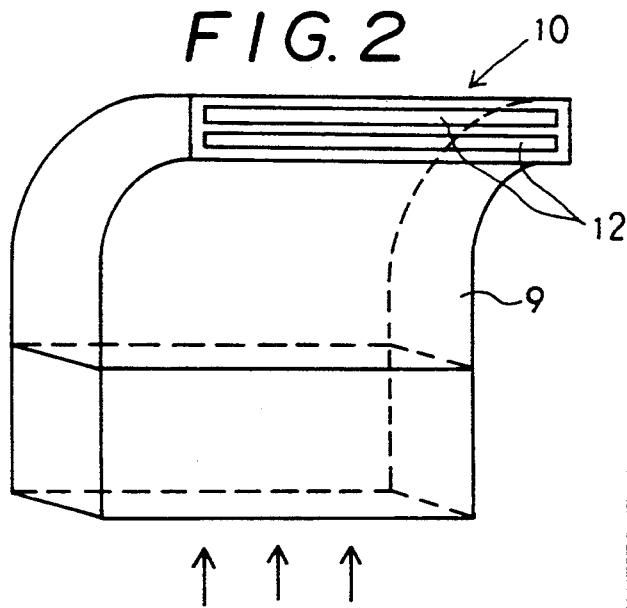
FIG. 2 is a perspective view of the blowing port included in FIG. 1.
Figure 3:
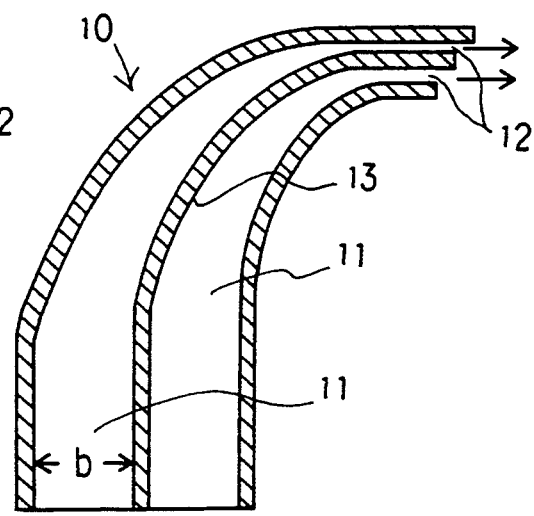
FIG. 3 is a vertical cross-sectional view of the blowing port included in FIG. 1.

As shown in FIGS. 2 and 3, the blowing port (10) of the invention includes a duct (9) of a rectangular cross-section and a plurality of passages (11) defined within the duct so that the cross-section of the duct is divided with one or more partitions extending parallel to the long side thereof. The duct (9) includes an upwards extending portion and upper portion curved inwardly so that it discharges clean air in substantially horizontal direction. Each passage (11), at least upper portion thereof is formed convergently to its upper end and thus the end of the passage (11) forms a long slit (12) extending transversely, as shown in FIG. 2. Upper portion of the respective passages (11) is curved slightly inwardly.

The respective slits (12) usually extend in parallel with side walls of the case (1). In many cases the duct (9) has two or three passages, and the breadth of the slit (12) at the end of the duct (9) is preferably 1-3 mm. The respective passages (11), as shown in FIG. 3, are defined with partition wall or walls (13), and extend from lower portion of the blowing port duct (9) to the end thereof.

Thus, clean air in the duct (9) is divided to the passages (11) and guided to the slits (12). The ratio of the maximum breadth of the passage (11) to the breadth of the slit (12) is usually 5:1-10:1.

Figure 4:
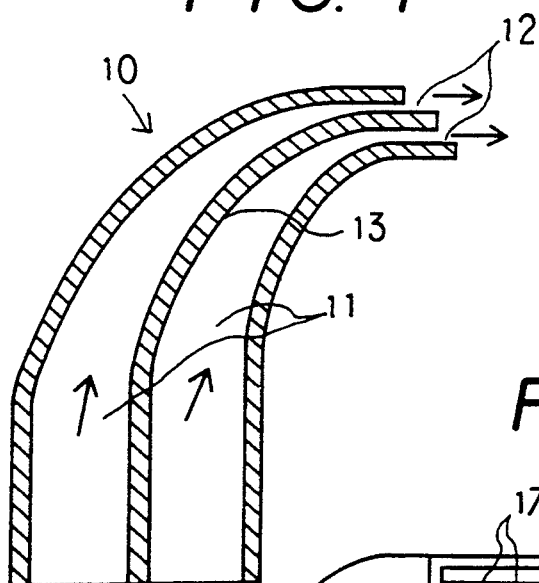
FIG. 4 is also a vertical cross-sectional view showing another embodiment of the blowing port of the invention.
Figure 5:
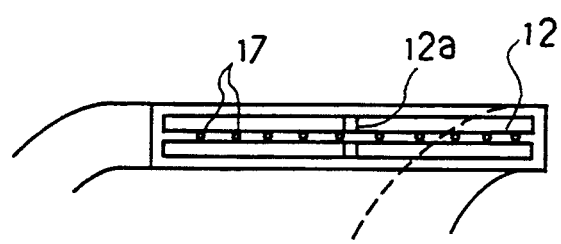
FIG. 5 is a perspective view showing a portion of the blowing port according to a further embodiment.
Figure 6:
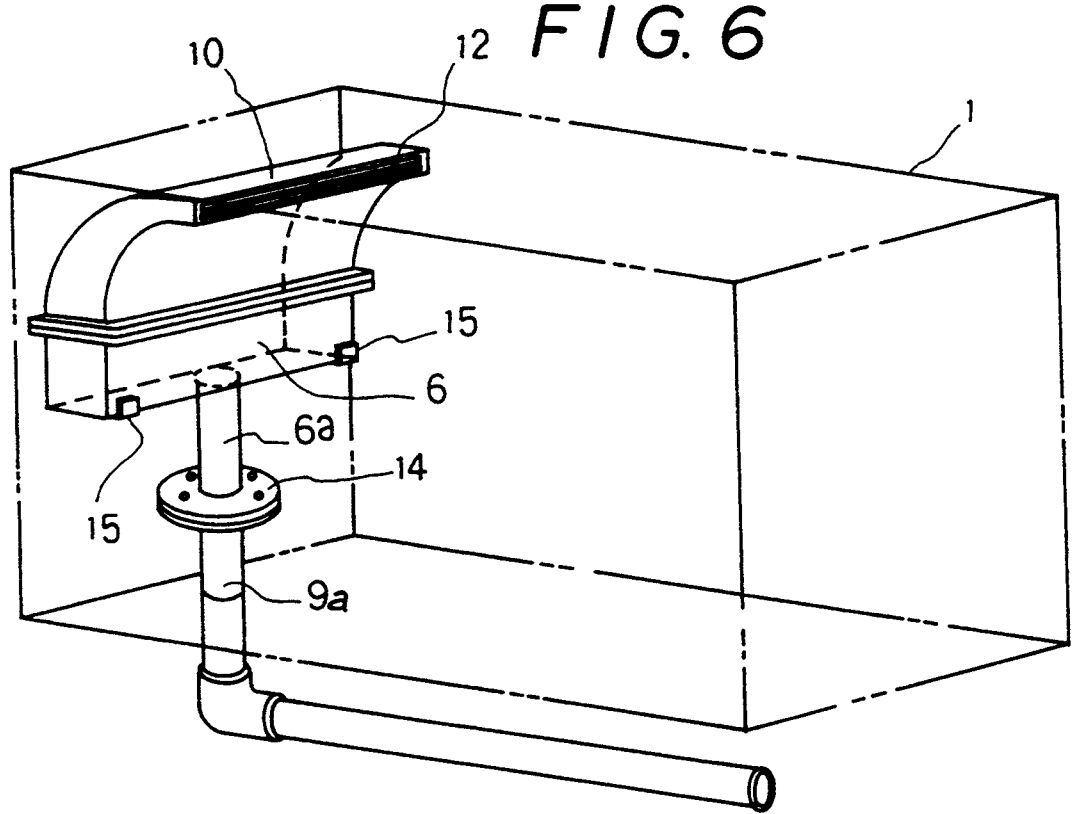
FIG. 6 is a perspective view showing a portion of a washing apparatus including a blowing port embodied by the invention.
Figure 7:
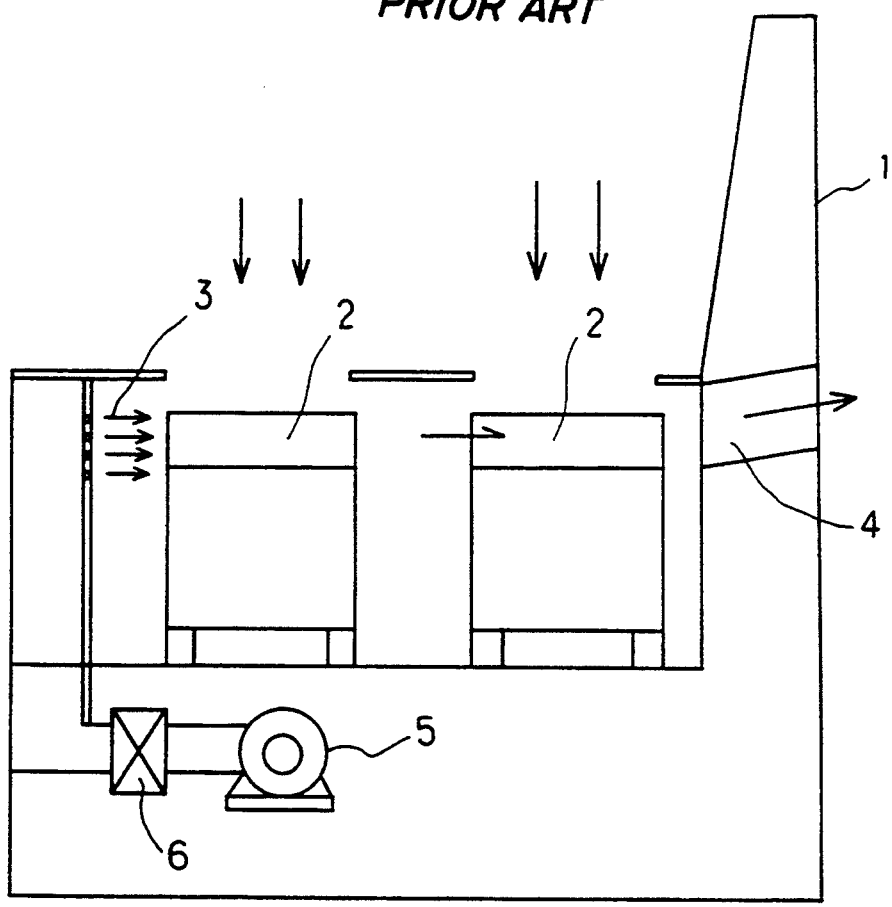
FIG. 7 is a side elevational view of an apparatus for washing semiconductor materials having a conventional blowing port.

The slits (12) at the end of the blowing port (10) will be formed in such a way that upper slit is more projected inwardly than lower one, as shown in FIG. 3. However, in case as shown in FIG. 4, the slits (12) will be formed so that lower slit is more projected inwardly than upper one. Also, as shown in FIG. 5, the respective slits (12) desirably has one or more reinforcement chips 12a at one or more suitable positions thereof. The reinforcement chips act against distortion of the slit and serve to keep its adequate form. Furthermore, ionizers 17 are desirably mounted on the end of the blowing port (10) for removing electrostatic charge. Such ionizers ionize clean air flown out through the blowing port (10) to thereby to neutralize possible electrostatic charge, if any charge will be occurred on semiconductor wafers.

Although the air filter (6), as shown in FIG. 1, will be located in position between the blowing port (10) and the fan (5) for feeding clean air to the same, it is preferable to disassembly dispose the filter (6) received in a box below the blowing port duct. And also, an inlet pipe (6a) connected to the filter (6) and a conduit (9a) for clean air are preferably connected each other releasably with a pipe coupling (14), whereby exchange of the filter can be easily accomplished. In the Figure, (15) denotes a stud for supporting an end of the filter (6).

As described above, the blowing port of the invention has at the end thereof a plurality of layered transverse slits (12), and clean air is guided with passages (11) to the slits and flows out therethrough. Thus, clean air flows in laminar flow over the respective washing tanks to the opposed suction port (4). This laminar flow of clean air prevents vapor generated in cleaning chemical tanks from lifting upwards, so that such vapor is prevented from entering the final washing tanks. Also, since the end of the blowing port (10) forms a plurality of long transverse slits, this arrangement prevents water splashes from entering the blowing port (10) to thereby avoid any damages of the air filter (6).

Figure 8:
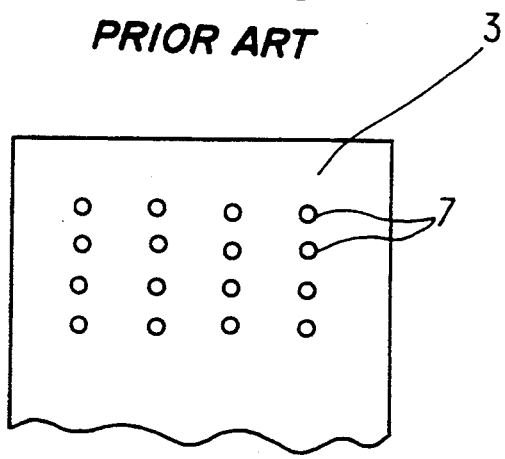
FIG. 8 is an elevational view of the conventional blowing port included in FIG. 7.
Figure 9:
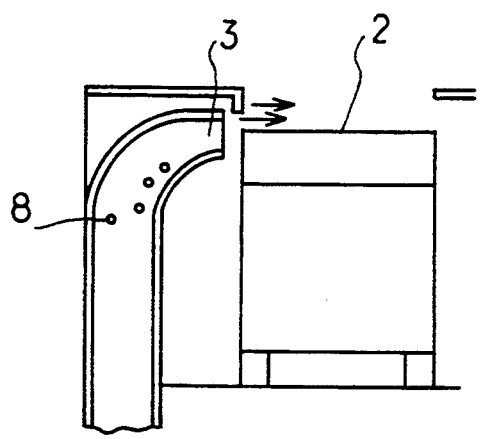
FIG. 9 is a partial elevational view of a washing apparatus showing another type of conventional blowing port.

On the other hand, prior art blowing port (3) has many holes (7) as shown in FIG. 8 or one opening of the duct as shown in FIG. 9, and therefore as described above, drawbacks such as turbulence or entrance of water splashes (8) are accompanied.

The invention overcomes such prior art drawbacks. Therefore, the blowing port of the invention can avoid influence of vapor from cleaning chemical tanks on semiconductor wafers put in the final washing tanks by means of laminar flow of clean air.

Having now fully described the present invention, it will be apparent to one of ordinary skill in the art that many changes and modifications can be made thereto without departing from the spirit or scope of the invention as set forth herein.

What is claimed is:

1. An apparatus for washing semiconductor materials, said apparatus comprising:
   a case;
   a plurality of washing tanks disposed within said case; and
   a blowing port having an upwardly extending duct disposed at a side of said case, said duct having a few passages formed therein, at least the upper portion of each said passage being formed continuously convergently to an outlet in the form of a transverse slit, said transverse slits being vertically stacked so as to form a horizontal laminar flow of clean air over said washing tanks to a suction port located at a side of said case opposite said blowing port.

2. An apparatus for washing semiconductor materials set forth in claim 1, wherein the respective slits at the end of the passages have one or a plurality of reinforcement chips.

3. An apparatus for washing semiconductor materials set forth in claim 1, wherein there are ionizers mounted on the end of the passages to ionize clean air flown out through the blowing port.

* * * * *

UNITED STATES PATENT AND TRADEMARK OFFICE
CERTIFICATE OF CORRECTION

PATENT NO. : 5,362,274
DATED : November 8, 1994
INVENTOR(S) : Seiichiro AIGO

It is certified that error appears in the above-indentified patent and that said Letters Patent is hereby corrected as shown below:

On title page, under item [19], "Seiichiro" should be --Aigo-- and in item [75] change the inventor's name from "Aigo SEIICHIRO" to --Seiichiro AIGO--.

Signed and Sealed this

Sixth Day of June, 1995

*Attest:*

BRUCE LEHMAN

*Attesting Officer*     *Commissioner of Patents and Trademarks*